(12) United States Patent
Wang

(10) Patent No.: US 8,280,097 B2
(45) Date of Patent: Oct. 2, 2012

(54) MICROELECTROMECHANICAL SYSTEM DIAPHRAGM AND FABRICATING METHOD THEREOF

(75) Inventor: Ming-I Wang, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 898 days.

(21) Appl. No.: 12/196,016

(22) Filed: Aug. 21, 2008

(65) Prior Publication Data
US 2010/0044147 A1 Feb. 25, 2010

(51) Int. Cl.
*H04R 7/14* (2006.01)
(52) U.S. Cl. .................. 381/399; 181/164; 427/100
(58) Field of Classification Search .............. 381/399; 181/164; 427/100
See application file for complete search history.

(56) References Cited

U.S. PATENT DOCUMENTS

| 6,936,524 | B2 | 8/2005 | Zhu et al. | |
|---|---|---|---|---|
| 6,943,448 | B2 | 9/2005 | Gabriel et al. | |
| 7,019,955 | B2 | 3/2006 | Loeb et al. | |
| 7,049,051 | B2 | 5/2006 | Gabriel et al. | |
| 7,202,101 | B2 | 4/2007 | Gabriel et al. | |
| 7,215,527 | B2 | 5/2007 | Neumann, Jr. et al. | |
| 2006/0093171 | A1* | 5/2006 | Zhe et al. | 381/191 |
| 2009/0175477 | A1* | 7/2009 | Suzuki et al. | 381/355 |
| 2009/0298216 | A1 | 12/2009 | Shih | |

* cited by examiner

*Primary Examiner* — Alexander Ghyka
*Assistant Examiner* — Stanetta Isaac
(74) *Attorney, Agent, or Firm* — Ding Yu Tan

(57) ABSTRACT

A microelectromechanical system diaphragm is provided. The microelectromechanical system diaphragm includes a substrate, a first conductive layer, a second conductive layer, a first dielectric layer, and a second dielectric layer. The first conductive layer is disposed on the substrate. The first conductive layer has a flexible portion in which a plurality of trenches is formed. The second conductive layer is disposed between the first conductive layer and the substrate, in which the flexible portion is located above the second conductive layer. The first dielectric layer is disposed between the second conductive layer and the substrate. The second dielectric layer is disposed between the substrate and a portion of the first conductive layer so as to suspend the flexible portion. Furthermore, at least one first opening is formed in the first conductive layer.

14 Claims, 6 Drawing Sheets

MICROELECTROMECHANICAL SYSTEM DIAPHRAGM AND FABRICATING METHOD THEREOF

BACKGROUND OF THE INVENTION

1. Field of the Invention

The present invention generally relates to a microelectromechanical system (MEMS) diaphragm and a fabricating method thereof, in particular, to an MEMS system diaphragm and a fabricating method thereof capable of reducing a residual stress in an upper electrode, enhancing a reliability and sensitivity of the upper electrode, and reducing fabricating steps.

2. Description of Related Art

Along with the progress of technology, various MEMS devices are fabricated by a micro-machining technique. For example, the MEMS devices include motors, pumps, valves, switches, sensors, pixels, diaphragms, etc.

The diaphragms manufactured by the MEMS technique (hereinafter MEMS diaphragms) have advantages of light weight, small volume, good signal quality, etc, so MEMS diaphragms increasingly become the mainstream products of mini diaphragms. Furthermore, due to the growing demands for mobile phones, the requirements on the sound-receiving quality and size minimization of mobile phones and the circuit integration level are stricter. Moreover, along with the gradual maturity of the hearing aids technique, the demands for MEMS diaphragms grow sharply.

Generally speaking, a method of fabricating a MEMS diaphragm includes forming a lower electrode, a dielectric layer, and an upper electrode in sequence on a substrate and then removing the dielectric layer between the lower electrode and the upper electrode. Furthermore, in a conventional MEMS diaphragm, usually, a material of the upper electrode is a metal. However, after the dielectric layer between the upper electrode and the lower electrode is removed, the metal material has larger residual stress, so the upper electrode is easily warped, which causes quality deterioration of the MEMS diaphragm.

Furthermore, in order to solve the problem that the upper electrode is easily warped, usually, before removing the dielectric layer between the upper electrode and the lower electrode, an etching process is performed to form meshes in the upper electrode to release a residual stress in the upper electrode. The upper electrode has the meshes, so the area of the force bearing surface is reduced when the sound pressure wave sensing of the upper electrode is performed, and thus the sensitivity is lowered. Therefore, the upper electrode is sealed by a polymer thin film in the subsequent process.

However, the polymer thin film does not have the characteristic of high temperature resistance, so the polymer thin film may be easily damaged in the subsequent high temperature process. In addition, although the method may solve the problem that the upper electrode is easily warped, the reliability of the upper electrode is reduced, and the fabricating steps are increased.

SUMMARY OF THE INVENTION

Accordingly, the present invention is directed to an MEMS diaphragm capable of reducing a residual stress in an upper electrode and enhancing a reliability and sensitivity of the upper electrode.

The present invention is further directed to a method of fabricating an MEMS diaphragm capable of reducing fabricating steps of the MEMS diaphragm.

The present invention provides an MEMS diaphragm. The MEMS diaphragm includes a substrate, a first conductive layer, a second conductive layer, a first dielectric layer, and a second dielectric layer. The first conductive layer is disposed on the substrate. The first conductive layer has a flexible portion in which a plurality of trenches is formed. The second conductive layer is disposed between the first conductive layer and the substrate, in which the flexible portion is located above the second conductive layer. The first dielectric layer is disposed between the second conductive layer and the substrate. The second dielectric layer is disposed between the substrate and a portion of first conductive layer, so as to suspend the flexible portion. Furthermore, at least one first opening is formed in the first conductive layer.

In the MEMS diaphragm according to an embodiment of the present invention, the substrate, the first dielectric layer, and the second conductive layer have at least one second opening.

In the MEMS diaphragm according to an embodiment of the present invention, the structure further includes a protective plug disposed in the second dielectric layer and connected to the first conductive layer and the substrate.

In the MEMS diaphragm according to an embodiment of the present invention, a material of the first conductive layer is, for example, metal, alloy or polysilicon.

In the MEMS diaphragm according to an embodiment of the present invention, a material of the second conductive layer is for example metal, alloy, or polysilicon.

The present invention further provides a method of fabricating an MEMS diaphragm. First, a substrate is provided. Then, a first dielectric layer and a first conductive layer are formed in sequence on the substrate. Next, a second dielectric layer is formed on the substrate, and the second dielectric layer covers the first conductive layer. Thereafter, a second conductive layer is formed on the second dielectric layer. Then, a plurality of trenches is formed in the second conductive layer, so as to form a flexible portion above the first conductive layer. At least one first opening is formed in the second conductive layer. Next, the second dielectric layer between the flexible portion and the first conductive layer is removed through the first opening.

In the method of fabricating the MEMS diaphragm according to an embodiment of the present invention, after forming the first opening and before removing the second dielectric layer between the flexible portion and the first conductive layer, the method further includes forming at least one second opening in the substrate, the first dielectric layer, and the first conductive layer.

In the method of fabricating an MEMS diaphragm according to an embodiment of the present invention, after forming the second dielectric layer and before forming the second conductive layer, the method further includes forming a protective plug connected to the substrate in the second dielectric layer.

In the present invention, the conductive layer having larger area is used as the upper electrode, and the trenches are formed in the upper electrode, such that the upper electrode has sufficient reliability, and the residual stress in the upper electrode may also be reduced, so as to solve the problem that the upper electrode is easily warped. Furthermore, the upper electrode of the present invention is a conductive layer having larger area, such that in the pressure sensing and the acoustic wave sensing process, the area of the force bearing surface of the upper electrode is increased, and the sensitivity is improved. In addition, the upper electrode of the present invention is the conductive layer having larger area, so the polymer thin film does not need to be formed on the upper electrode additionally, such that the fabricating steps are reduced.

In order to have a further understanding of the above and other objectives, features, and advantages of the present invention, a detailed description is given as follows with the embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
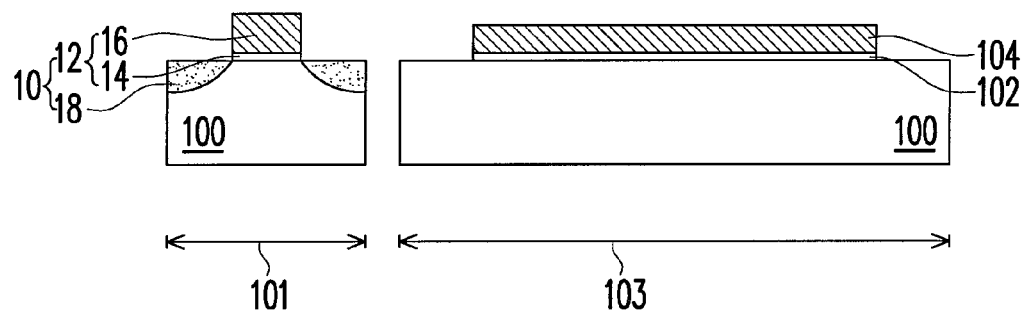
FIGS. 1A to 1D are cross-sectional views illustrating processes for fabricating an MEMS diaphragm according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

The processes for fabricating an MEMS diaphragm of the present invention may be integrated with the process of the complementary metal oxide semiconductor transistor and the process of interconnection. Therefore, in the following embodiments, the processes for fabricating the metal oxide semiconductor transistor, the interconnection, and the MEMS diaphragm are used to illustrate the present invention at the same time.

FIGS. 1A to 1D are cross-sectional views illustrating processes for fabricating an MEMS diaphragm according to an embodiment of the present invention. First, referring to FIG. 1A, a substrate 100 is provided. The substrate 100 is, for example, a silicon substrate and has regions 101 and 103. Then, a complementary metal oxide semiconductor transistor 10 is formed on the substrate 100 in the region 101, and a dielectric layer 102 and a conductive layer 104 are formed in sequence on the substrate 100 in the region 103. The conductive layer 104 is used as a lower electrode of the MEMS diaphragm. The complementary metal oxide semiconductor transistor 10 includes a gate structure 12 located on the substrate 100 and a source/drain region 18 located in the substrate 100 on two sides of the gate structure 12. The gate structure 12 includes a gate dielectric layer 14 and a gate 16 located on the gate dielectric layer 14. In this embodiment, the fabrication of the dielectric layer 102 and the conductive layer 104 may be integrated with the fabrication of the gate structure 12, so a material of the dielectric layer 102 may be an oxide (the same material of the gate dielectric layer 14), and a material of the conductive layer 104 may be metal, alloy, or polysilicon (the same material of the gate 16). Definitely, in other embodiments, the dielectric layer 102 and the conductive layer 104 may also be fabricated after the complementary metal oxide semiconductor transistor 10 is formed.

Figure 1B:
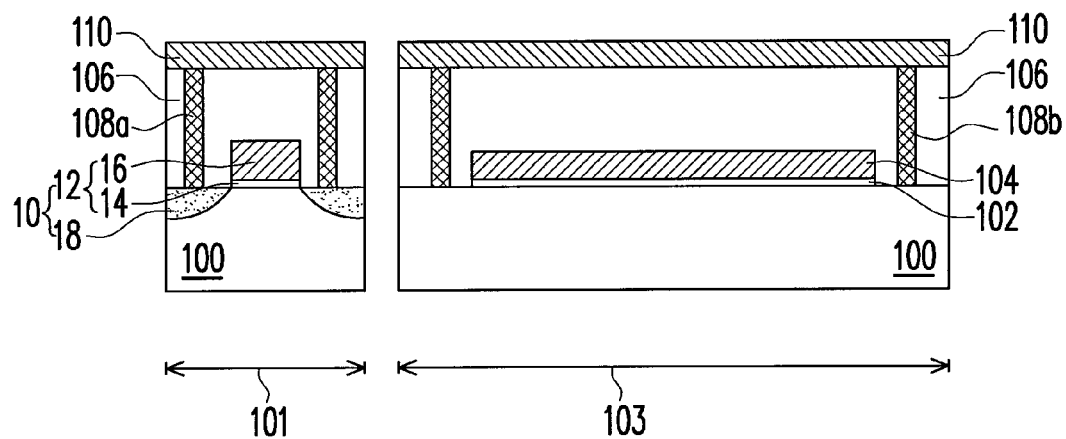

Then, referring to FIG. 1B, the interconnection process is performed in the region 101. In the interconnection process, for example, a dielectric layer 106 is first formed on the substrate 100 in the region 101. A material of the dielectric layer 106 is, for example, an oxide. Then, a plug 108a electrically connected to the source/drain region 18 is formed in the dielectric layer 106. A material of the plug 108a is, for example, metal or alloy. Thereafter, a conductive layer 110 is formed on the dielectric layer 106. A material of the conductive layer 110 is, for example, metal, alloy or polysilicon. Furthermore, at the same time of the interconnection process, the dielectric layer 106, a protective plug 108, and the conductive layer 110 are formed on the substrate 100 in the region 103. The conductive layer 110 is used as an upper electrode of the MEMS diaphragm. In detail, when the dielectric layer 106 is formed in the region 101, the dielectric layer 106 is formed on the substrate 100 in the region 103, and the dielectric layer 106 covers the conductive layer 104. When the plug 108a is formed in the region 101, a protective plug 108b connected to the substrate 100 is formed in the dielectric layer 106 in the region 103. When the conductive layer 110 is formed in the region 101, the conductive layer 110 is formed on the dielectric layer 106 in the region 103.

Figure 1C:
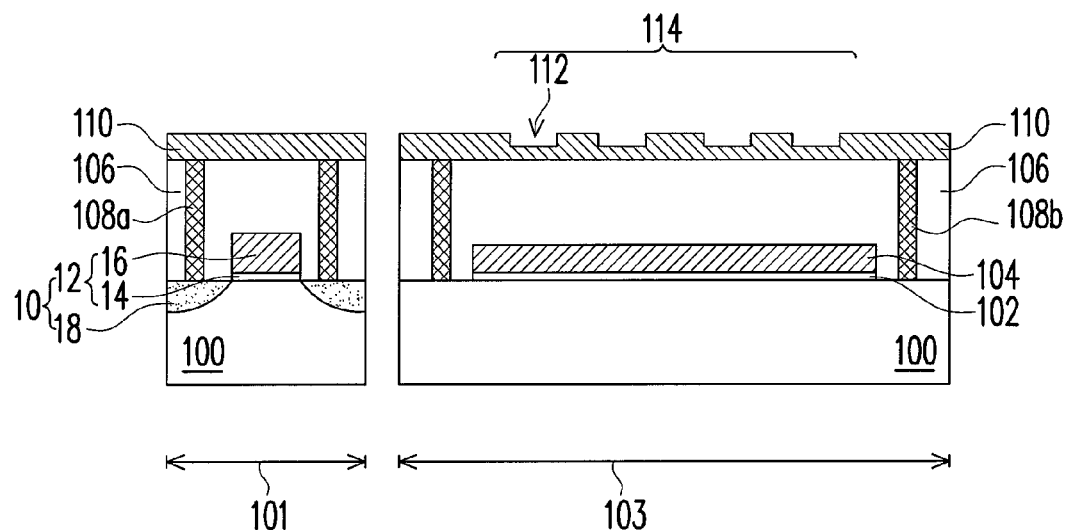

Next, referring to FIG. 1C, trenches 112 are formed in the conductive layer 110 in the region 103, so as to form a flexible portion 114 above the conductive layer 104. The trenches 112 may be formed by, for example, performing a photolithography process and an etching process in sequence to remove a portion of the conductive layer 110. It should be noted that the number and the pattern of the trenches 112 may be adjusted according to the practical requirements.

Figure 1D:
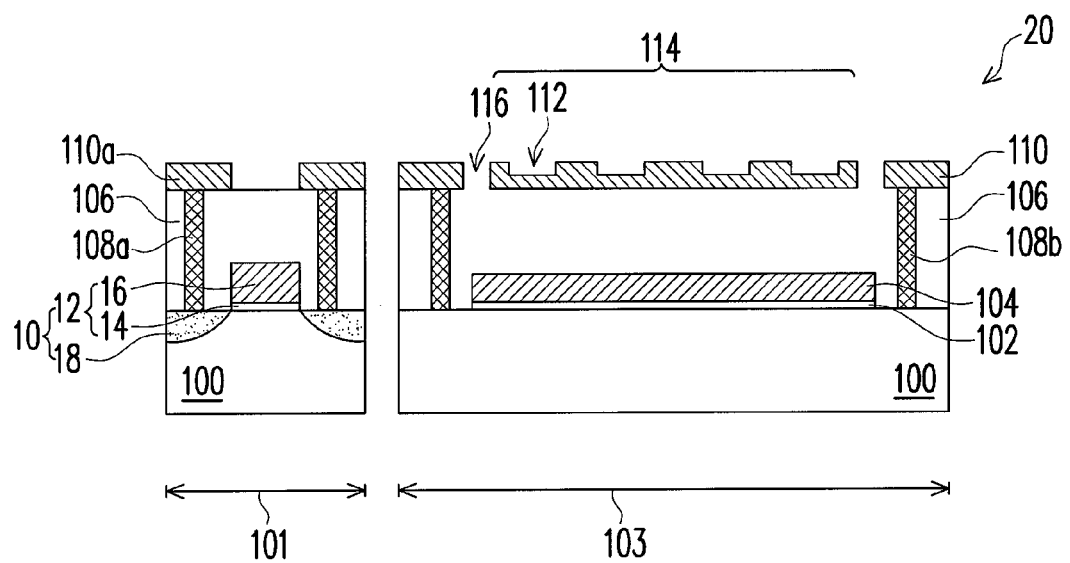

Then, referring to FIG. 1D, openings 116 are formed in the conductive layer 110. The openings 116 may be formed by, for example, performing the photolithography process and the etching process in sequence to remove a portion of the conductive layer 110 until the dielectric layer 106 is exposed. Furthermore, the conductive layer 110 may be patterned to form a conductive line pattern 110a during the formation of the openings 116. Then, after the openings 116 are formed, the dielectric layer 106 between the flexible portion 114 and the conductive layer 104 is removed through the openings 116, and thus the fabrication of an MEMS diaphragm 20 of the present invention is completed. The dielectric layer 106 between the flexible portion 114 and the conductive layer 104 may be removed by, for example, performing a vapor etching process. It should be noted that the protective plug 108b is formed in the dielectric layer 106 in the step of FIG. 1B, so when the etching process of removing the dielectric layer 106 is performed, only the dielectric layer 106 between the flexible portion 114 and the conductive layer 104 is removed, instead of completely removing the dielectric layer 106 in the region 103. Furthermore, a thickness of the dielectric layer 102 formed between the conductive layer 104 and the substrate 100 is quite thin (that is, a distance between the conductive layer 104 and the substrate 100 is quite small). Therefore, when the etching process for removing the dielectric layer 106 is performed, the dielectric layer 102 will not be removed completely therewith.

Hereinafter, the structure in FIG. 1D is used to illustrate the MEMS diaphragm of the present invention.

Figure 2A:
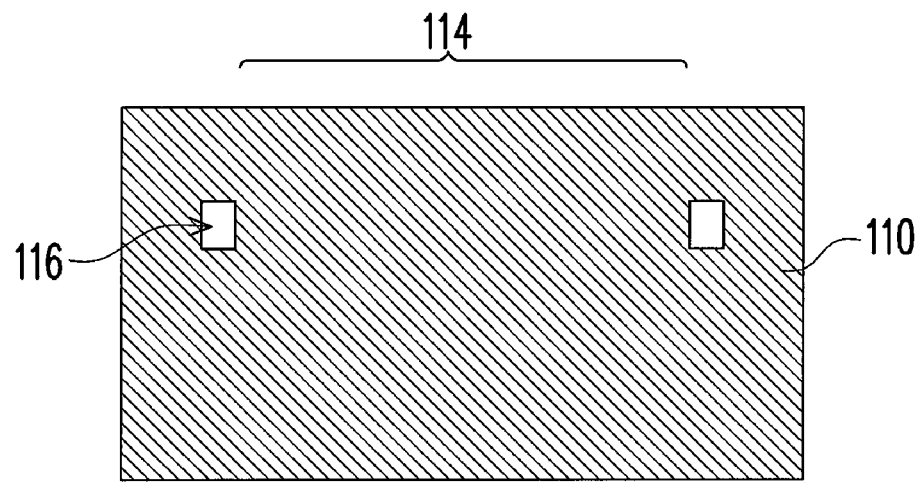
FIG. 2A is a schematic top view of a conductive layer 110 in FIG. 1D.

FIG. 2A is a schematic top view of the conductive layer 110 in FIG. 1D. Referring to FIGS. 1D and 2, the MEMS diaphragm 20 includes the substrate 100, the conductive layers 104 and 110, and the dielectric layers 102 and 106. The conductive layer 110 is disposed on the substrate 100 to serve as the upper electrode of the MEMS diaphragm 20. The conductive layer 110 has the flexible portion 114, and the flexible portion 114 has the trenches 112. The material of the conductive layer 110 is, for example, metal, alloy or polysilicon. The upper electrode has the trenches 112, such that the residual stress in the upper electrode can be reduced, so as to solve the problem that the upper electrode is easily warped. Furthermore, the upper electrode is the conductive layer having larger area, so the upper electrode has the sufficient reliability.

Referring to FIGS. 1D and 2A, the conductive layer 104 is disposed between the conductive layer 110 and the substrate 100, and serves as the lower electrode of the MEMS diaphragm 20, in which the flexible portion 114 is located above the conductive layer 104. The dielectric layer 102 is disposed between the conductive layer 104 and the substrate 100, for isolating the conductive layer 104 from the substrate 100. The dielectric layer 106 is disposed between the substrate 100 and a portion of conductive layer 110, for supporting the conductive layer 110 and suspending the flexible portion 114. Furthermore, the conductive layer 110 has the openings 116. The mechanical parameters of the upper electrode may be adjusted by adjusting the number, the position, or the aperture of the trenches 112 and the openings 116. In addition, the dielectric layer 106 has the protective plug 108b connected to the conductive layer 110 and the substrate 100.

Figure 2B:
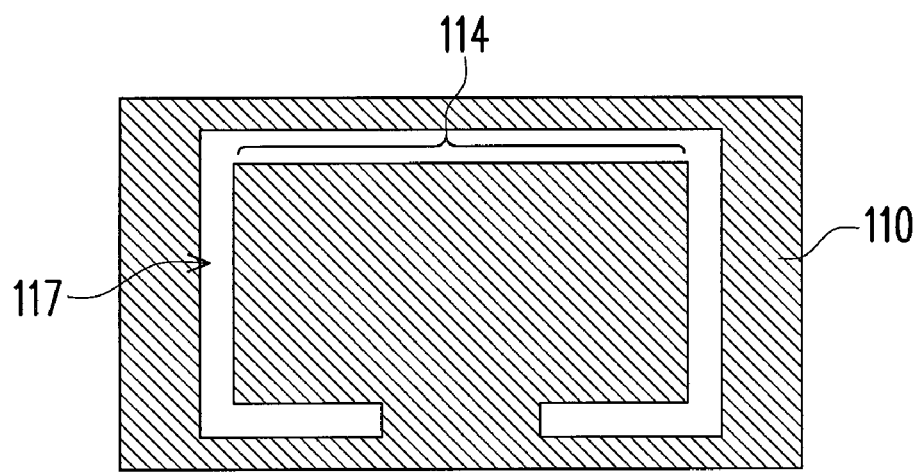
FIG. 2B is a schematic top view of a conductive layer 110 according to another embodiment of the present invention.

In this embodiment, the conductive layer 110 has a plurality of the openings 116. In another embodiment, the conductive layer 110 may have a opening 117 around the flexible portion 114 as shown in FIG. 2B.

Figure 3A:
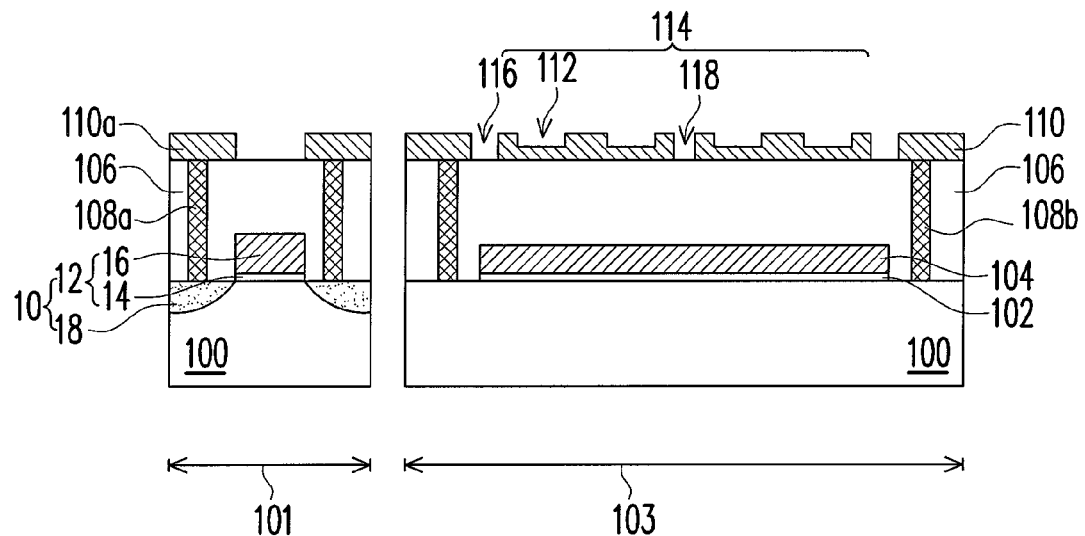
FIGS. 3A to 3B are cross-sectional views illustrating processes for fabricating an MEMS diaphragm according to another embodiment of the present invention.
Figure 3B:
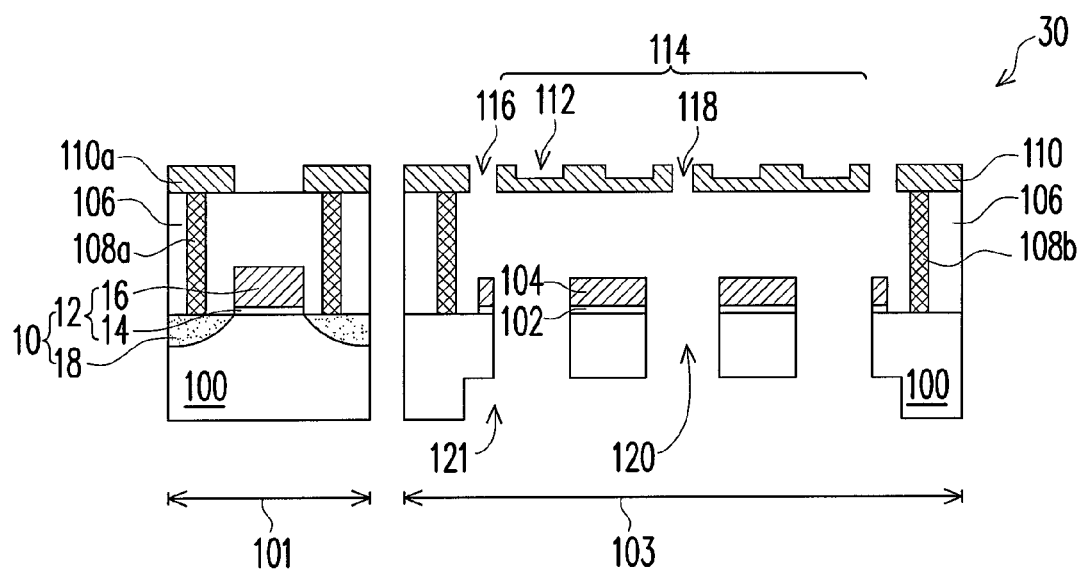

FIGS. 3A to 3B are cross-sectional views illustrating processes for fabricating an MEMS diaphragm according to another embodiment of the present invention. The process of FIG. 3A follows that of FIG. 1C. First, referring to FIG. 3A, after the trenches 112 are formed in the conductive layer 110 in the region 103, the openings 116 and 118 are formed in the conductive layer 110. The openings 116 and 118 may be formed by, for example, performing the photolithography process and the etching process in sequence to remove a portion of the conductive layer 110 until the dielectric layer 106 is exposed. The mechanical parameters of the upper electrode may be adjusted by adjusting the number, the position, or the aperture of the trenches 112 and openings 116 and 118. Furthermore, the conductive layer 110 may be patterned to form a conductive line pattern 110a during the formation of the openings 116 and 118.

Then, referring to FIG. 3B, openings 120 and a cavity 121 are formed in the substrate 100, the dielectric layer 102, and the conductive layer 104. The openings 120 and the cavity 121 may be formed by, for example, performing the first photolithography process and the first etching process in sequence to remove a portion of the substrate 100 to form the openings 120. At this time, the dielectric layer 106 is not exposed by the openings 120. Then, the second photolithography process and the first etching process are performed in sequence to remove a portion of the substrate 100, the dielectric layer 102, and the conductive layer 104 to form the cavity 121 and the openings 120 exposing the dielectric layer 106. Furthermore, in another embodiment, the openings 120 exposing the dielectric layer 106 may be formed without forming the cavity 121.

Referring to FIG. 3B, the dielectric layer 106 between the flexible portion 114 and the conductive layer 104 is removed through the openings 116, 118, and 120, and then the fabrication of an MEMS diaphragm 30 of the present invention is completed. The method of removing the dielectric layer 106 between the flexible portion 114 and the conductive layer 104 is, for example, the vapor etching process.

In this embodiment, the openings 116 and 118 are formed in the conductive layer 110 and the openings 120 and the cavity 121 are formed in the substrate 100, the dielectric layer 102, and the conductive layer 104. Definitely, in other embodiments, the openings 116 are formed in the conductive layer 110 and the openings 120 and the cavity 121 are formed in the substrate 100, the dielectric layer 102, and the conductive layer 104 without forming opening 118.

FIGS. 4A to 4D are cross-sectional views illustrating processes for fabricating an MEMS diaphragm according to still another embodiment of the present invention. The process of FIG. 4A follows that of FIG. 1C. First, referring to FIG. 4A, after the trenches 112 are formed in the conductive layer 110 in the region 103, the openings 116 and 118 are formed in the conductive layer 110, and the conductive layer 110 in the region 101 is patterned to form a conductive line pattern 110a at the same time. Then, the interconnection process is performed in the region 101. In this embodiment, only one layer of metal wire and a pad are formed, but in other embodiments, more layers of wire may be formed according to the practical requirements. In detail, after the openings 116 and 118 are formed, a dielectric layer 122 is formed on the substrate 100. Then, a plug(not shown) is formed in the dielectric layer 122 in the region 101, and a protective plug 124b is formed in the dielectric layer 122 in the region 103. Next, a conductive layer 126 serving as the pad is formed on the dielectric layer 122. Thereafter, a protective layer 128 is formed on the dielectric layer 122 in the region 101 and 103, and the protective layer 128 covers the conductive layer 126. Then, a hard mask layer 130 is formed on the protective layer 128.

Figure 4A:
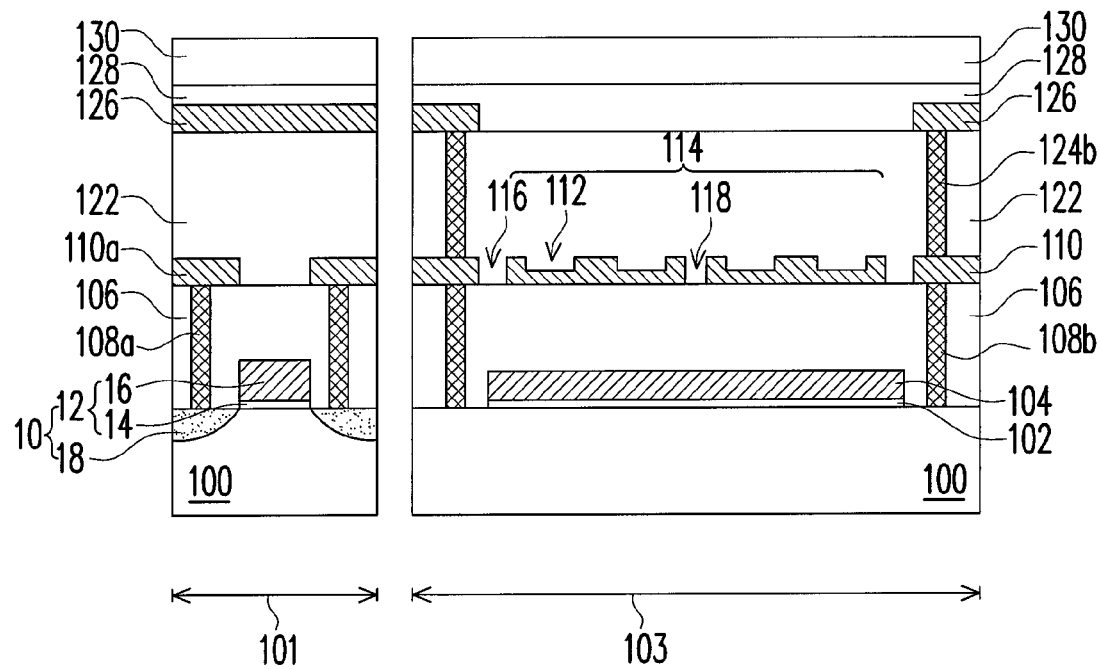
FIGS. 4A to 4D are cross-sectional views illustrating processes for fabricating an MEMS diaphragm according to still another embodiment of the present invention.
Figure 4B:
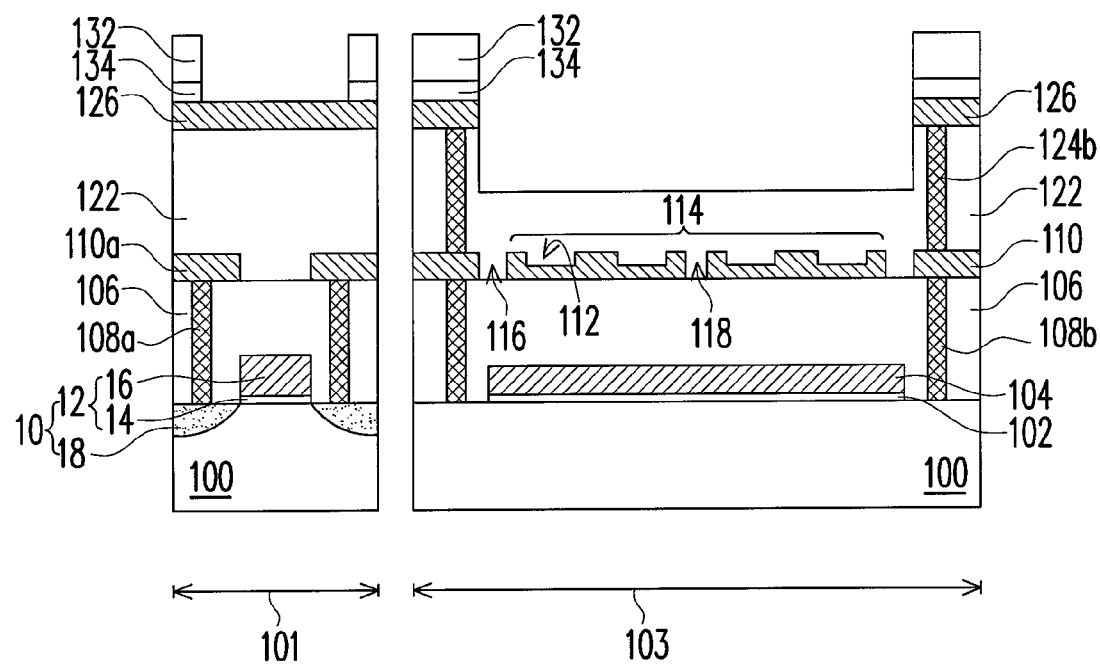

Then, referring to FIG. 4B, the hard mask layer 130 and the protective layer 128 are patterned, so as to form a patterned hard mask layer 132 and a patterned protective layer 134 covering the conductive layer 126, wherein the conductive layer 126 serving as the pad is exposed by the patterned hard mask layer 132 and the patterned protective layer 134 in the region 101. Then, the etching process is performed by using the patterned hard mask layer 132 and the patterned protective layer 134 as the mask to remove a portion of the dielectric layer 122. The etching process is, for example, an anisotropic etching process.

Figure 4C:
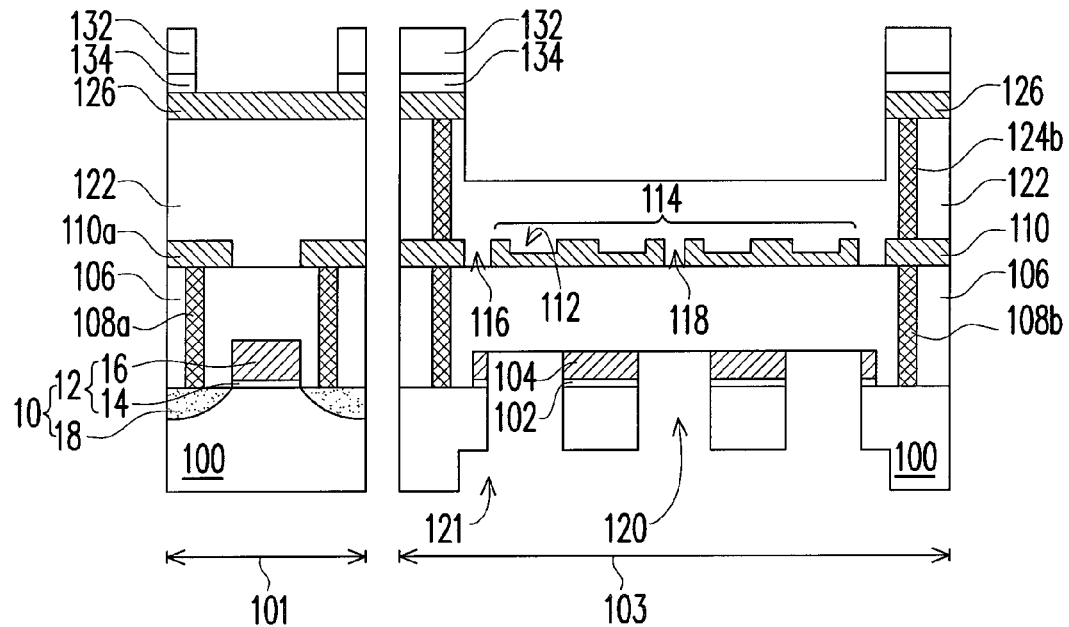

Next, referring to FIG. 4C, the cavity 121 and the openings 120 exposing a portion of the dielectric layer 106 are formed in the substrate 100, the dielectric layer 102, and the conductive layer 104.

Figure 4D:
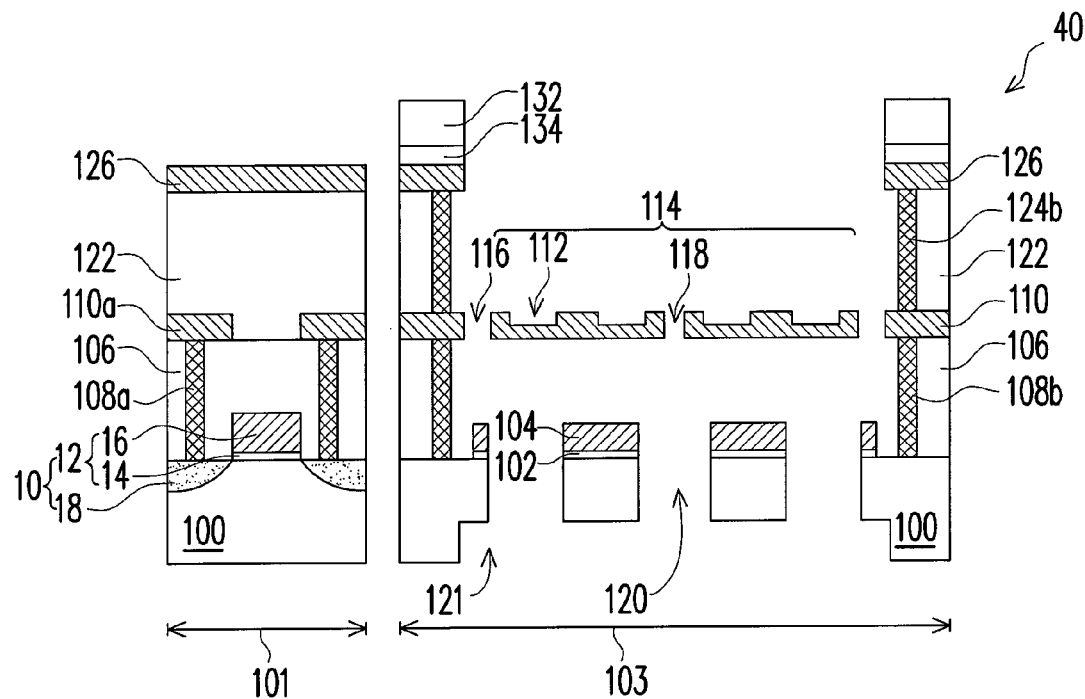

Then, referring to FIG. 4D, the dielectric layer 122 above the flexible portion 114 is removed, and the dielectric layer 106 between the flexible portion 114 and the conductive layer 104 is removed through the opening 116, 118, and 120, and thus the fabrication of an MEMS diaphragm 40 of the present invention is completed. The method of removing the dielectric layer 122 and the dielectric layer 106 is, for example, the vapor etching process. Since the protective plugs 108b and 124b are already formed in the dielectric layers 106 and 122 respectively, when the etching process is performed, the dielectric layers 106 and 122 in the region 103 will not be completely removed.

To sum up, in the present invention, the conductive layer having larger area is used as the upper electrode of the MEMS diaphragm, so the reliability of the upper electrode may be increased, and the area of the force bearing surface of the upper electrode may be increased in the pressure sensing or the acoustic wave sensing process, thereby improving the sensitivity of the device.

Furthermore, in the present invention, the trenches are formed in the upper electrode, so the residual stress in the upper electrode may be reduced, thereby solving the problem that the upper electrode is easily warped.

In addition, in the present invention, after the conductive layer serving as the upper electrode is formed, it is not necessary to additionally form a polymer thin film to seal the upper electrode, thereby simplifying the fabricating process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A microelectromechanical system (MEMS) diaphragm, comprising:
    a substrate;
    a first conductive layer, disposed on the substrate, and comprising a flexible portion, wherein the flexible portion comprises a plurality of trenches, and at least one first opening is formed in the first conductive layer;
    a second conductive layer, disposed between the first conductive layer and the substrate, wherein the flexible portion is located above the second conductive layer;
    a first dielectric layer, disposed between the second conductive layer and the substrate; and
    a second dielectric layer, disposed between the substrate and a portion of the first conductive layer, so as to suspend the flexible portion.

2. The MEMS diaphragm according to claim 1, wherein the substrate, the first dielectric layer, and the second conductive layer have at least one second opening.

3. The MEMS diaphragm according to claim 2, wherein the second opening perforates the substrate, the first dielectric layer, and the second conductive layer.

4. The MEMS diaphragm according to claim 1, further comprising a protective plug disposed in the second dielectric layer and connected to the first conductive layer and the substrate.

5. The MEMS diaphragm according to claim 1, wherein a material of the first conductive layer comprises metal, alloy or polysilicon.

6. The MEMS diaphragm according to claim 1, wherein a material of the second conductive layer comprises metal, alloy, or polysilicon.

7. The MEMS diaphragm according to claim 1, wherein the trenches don't perforates the flexible portion.

8. The MEMS diaphragm according to claim 1, wherein the second conductive layer is located directly under the flexible portion.

9. A method of fabricating an MEMS diaphragm, comprising:
    providing a substrate;
    forming a first dielectric layer and a first conductive layer in sequence on the substrate;
    forming a second dielectric layer on the substrate, wherein the second dielectric layer covers the first conductive layer
    forming a second conductive layer on the second dielectric layer;
    forming a plurality of trenches in the second conductive layer, so as to form a flexible portion above the first conductive layer;
    forming at least one first opening in the second conductive layer; and
    removing the second dielectric layer between the flexible portion and the first conductive layer through the at least one first opening.

10. The method of fabricating an MEMS diaphragm according to claim 9, after forming the at least one first opening and before removing the second dielectric layer between the flexible portion and the first conductive layer, further comprising forming at least one second opening perforating the substrate, the first dielectric layer, and the first conductive layer.

11. The method of fabricating an MEMS diaphragm according to claim 10, wherein the second dielectric layer between the flexible portion and the first conductive layer is removed through the at least one first opening and the at least one second opening.

12. The method of fabricating an MEMS diaphragm according to claim 9, after forming the second dielectric layer and before forming the second conductive layer, further comprising forming a protective plug connected to the substrate in the second dielectric layer.

13. The method of fabricating an MEMS diaphragm according to claim 9, wherein the trenches don't perforates the flexible portion.

14. The method of fabricating an MEMS diaphragm according to claim 9, wherein the second conductive layer is located directly under the flexible portion.

* * * * *